United States Patent [19]
Bertolini

[11] Patent Number: 6,072,339
[45] Date of Patent: Jun. 6, 2000

[54] CURRENT SENSING CIRCUIT WITH HIGH INPUT IMPEDANCE

[75] Inventor: Luca Bertolini, Milan, Italy

[73] Assignee: STMicroelectronics S.r.l, Agrate Brianza, Italy

[21] Appl. No.: 09/185,917

[22] Filed: Nov. 4, 1998

[30] Foreign Application Priority Data

Nov. 6, 1997 [IT] Italy .................................. MI97A2485

[51] Int. Cl.[7] .............................. G01R 19/00; G11C 7/00; H03F 3/45
[52] U.S. Cl. ................................ 327/54; 327/67; 327/87; 327/103
[58] Field of Search ................................. 327/51, 52, 54, 327/65, 67, 77, 87, 89, 103, 560, 563; 330/85

[56] References Cited

U.S. PATENT DOCUMENTS

| | | | |
|---|---|---|---|
| 5,606,277 | 2/1997 | Feliz | 327/311 |
| 5,789,973 | 8/1998 | Barrett, Jr. et al. | 327/561 |
| 5,844,440 | 12/1998 | Lenk et al. | 327/322 |

*Primary Examiner*—Toan Tran
*Assistant Examiner*—Anh-Tran Tra
*Attorney, Agent, or Firm*—Theodore E. Galanthay; Allen, Dyer, Doppelt, Milbrath & Gilchrist, P.A.

[57] ABSTRACT

A current sensing circuit with high input impedance comprises a first transconductance amplifier connected across the terminals of a resistor, through which a current to be measured flows. A voltage amplifier is cascade-connected to the first transconductance amplifier. A second transconductance amplifier is feedback connected between an output of the voltage amplifier and a virtual ground node of the voltage amplifier. A ratio between the output voltage of the voltage amplifier and the voltage across the resistor are equal, in absolute value, to a ratio of the transconductances of the first and second transconductance amplifiers.

21 Claims, 3 Drawing Sheets

6,072,339

1

CURRENT SENSING CIRCUIT WITH HIGH INPUT IMPEDANCE

FIELD OF THE INVENTION

The present invention relates to the field of electronic circuits, and more particularly, to a current sensing circuit.

BACKGROUND OF THE INVENTION

FIG. 1 is a diagram of a prior art current sensing circuit in which the current to be sensed, designated by Is, flows across a resistor Rs (defining a voltage Vi) while a common-mode voltage Vcm is applied to a terminal of the resistor Rs opposite a terminal where the current Is to be measured flows. The voltage sensed across the resistor Rs is then amplified by an operational amplifier 1 having a differential gain defined by Gd. The gain of the amplifier should, in principle, be constant to precisely amplify the sensed voltage. In some cases, the gain might be used to adjust the amplification as required.

The output voltage of the operational amplifier 1, designated as Vo, is obtained by multiplying the input voltage Vi by the differential gain Gd. There are basic requirements for the circuit shown in FIG. 1. First, a high impedance at the terminals of the resistor Rs is required, and therefore across the input of the operational amplifier 1. Another requirement is for the differential gain Gd to be precise and insensitive to operating conditions. An output voltage is required to be independent of the common-mode voltage Vcm, i.e., a high common-mode rejection ratio (CMRR) is desirable. Other requirements include a wide linear input range, and a minimal consumption of the silicon surface area needed for forming integrated circuits incorporating the circuit.

FIG. 2 is a view of a first embodiment of the circuit shown in FIG. 1, wherein the terminals A and B designate input points for the operational amplifier 2 for the voltage across the terminals of the resistor Rs, as shown in a similar way in FIG. 1. FIG. 3 is a view of a second embodiment of the circuit shown in FIG. 1. In both of these figures, the amplification gain is determined by ratios between resistors. Referring to FIG. 2, there are four resistors in the circuit for determining the amplification gain, whereas in FIG. 3, there are six resistors in the circuit for determining the amplification gain. Furthermore, a single operational amplifier 2 is used in the circuit of FIG. 2, while three operational amplifiers 3, 4, 5 are used in the circuit of FIG. 3.

Since the gains of the circuits of FIGS. 2 and 3 are determined by the ratios between the resistors, the resistors must be as equal as possible to each other to have accurate amplification. The equalization of the resistors is also necessary to avoid influencing the offset and the common-mode rejection ratio. Furthermore, the input impedance of the circuit of FIG. 2 is inherently low. Referring to the circuit of FIG. 3, a significant disadvantage is that it is more expensive to manufacture because of the number of operational amplifiers required. Therefore, the silicon surface area needed for forming the circuit on an integrated circuit is not negligible.

SUMMARY OF THE INVENTION

An object of the present invention is to provide a current sensing circuit which has an output voltage independent of the common-mode voltage applied between one terminal of a resistor, through which the current to be measured flows, and ground.

Another object of the present invention is to provide a current sensing circuit which has a high input impedance.

2

Yet another object of the present invention is to provide a current sensing circuit which allows precise and highly repeatable measurements.

Another object of the present invention is to provide a current sensing circuit which occupies the smallest possible silicon surface area when formed as part of an integrated circuit.

A further object of the present invention is to provide a current sensing circuit in which the reference voltage used in the amplifier circuit is not linked, in terms of its value, to the voltage at the terminals of the resistor by means of which the current flow is sensed.

Yet a further object of the present invention is to provide a current sensing circuit that is reliable and relatively easy to produce at competitive costs.

These objects, which will become apparent hereinafter, are achieved according to the present invention by a current sensing circuit with high input impedance. The current sensing circuit comprises a first transconductance amplifier connected to the terminals of a resistor through which a current to be measured flows. A voltage amplifier is connected in cascade to the first transconductance amplifier. A second transconductance amplifier is feedback-connected between the output of the voltage amplifier and a virtual ground node of the voltage amplifier. The ratio between an output voltage of the voltage amplifier and the voltage across the resistor are equal, in absolute value, to the ratio of the transconductances of the first and second transconductance amplifiers.

BRIEF DESCRIPTION OF THE DRAWINGS

Further characteristics and advantages of the present invention will become apparent from the following detailed description of a preferred, but not exclusive, embodiment of the circuit according to the present invention illustrated only by way of non-limitative examples in the accompanying drawings, wherein.

DETAILED DESCRIPTION OF THE PREFERRED EMBODIMENTS

Figure 1:
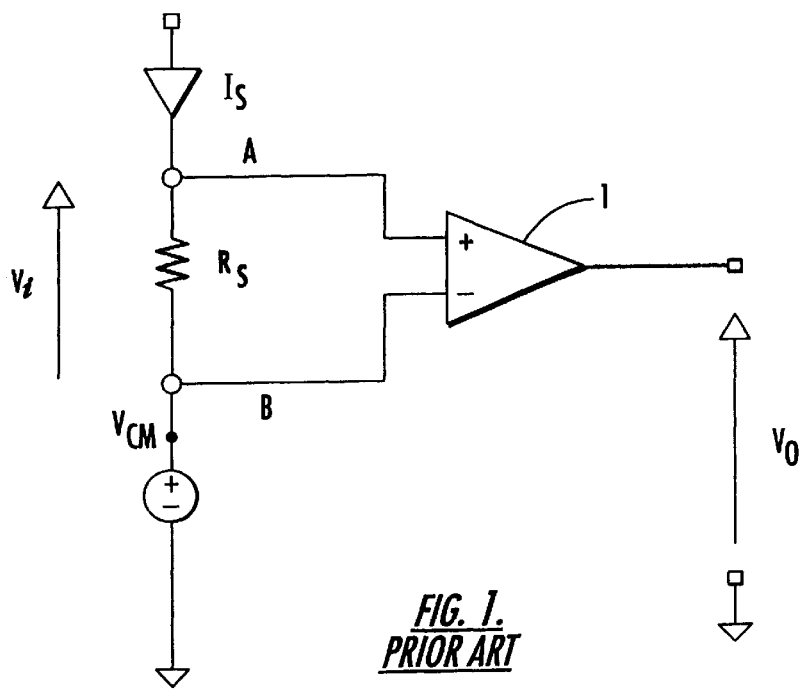
FIG. 1 is a diagram of a circuit for sensing a current that flows across a resistor, according to the prior art.
Figure 3:
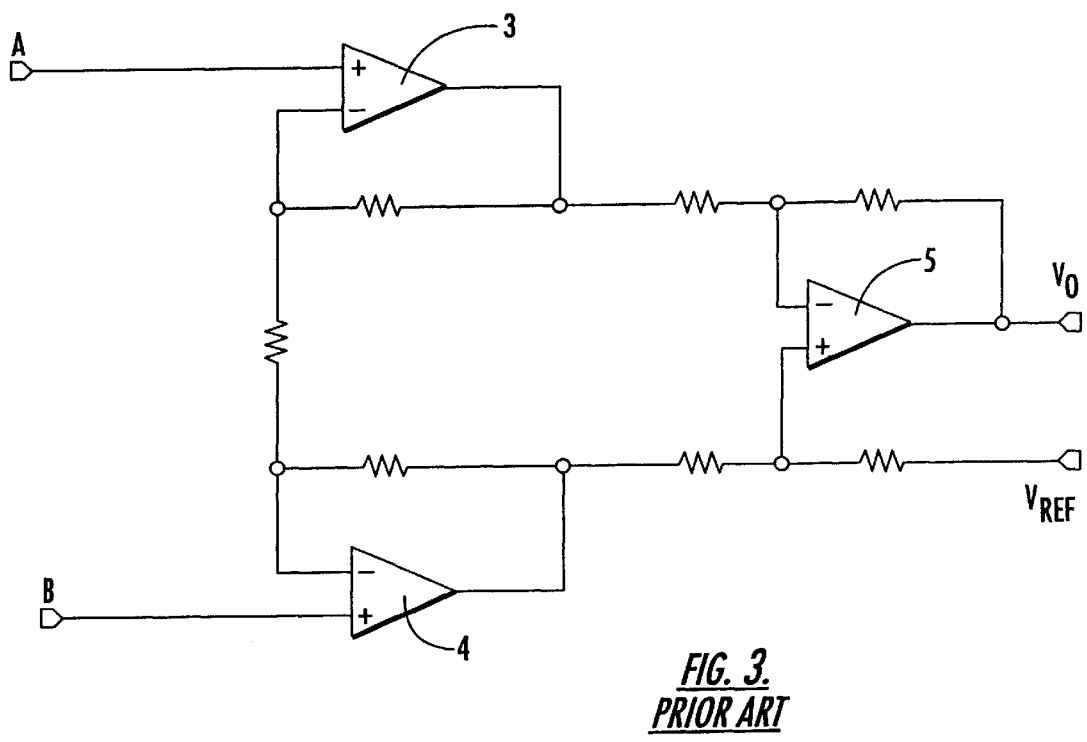
FIG. 3 is a diagram of a second embodiment of the current sensing circuit implemented according to the prior art diagram of FIG. 1.
Figure 2:
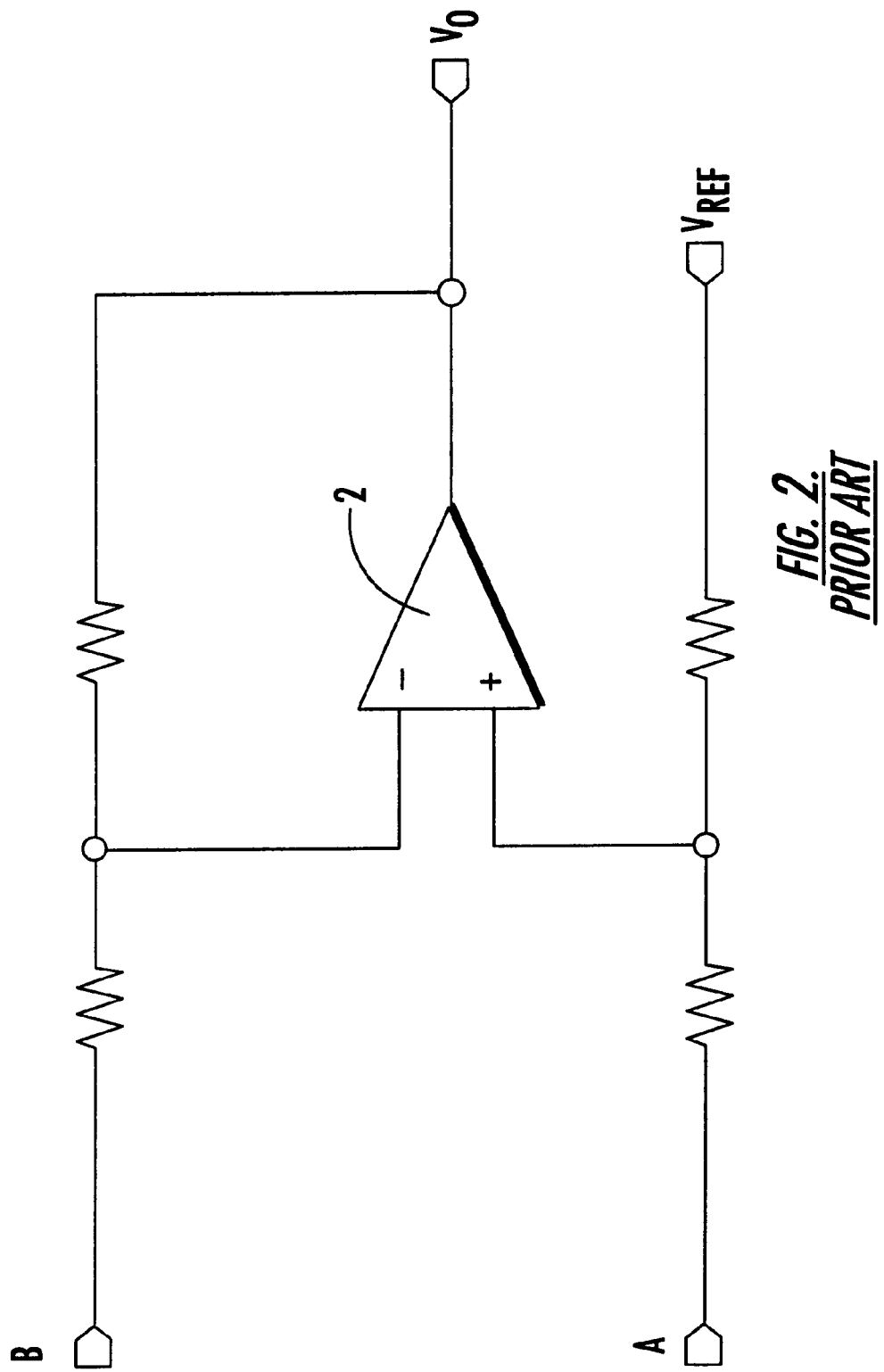
FIG. 2 is a diagram of a first embodiment of the current sensing circuit implemented according to the prior art diagram of FIG. 1.
Figure 4:
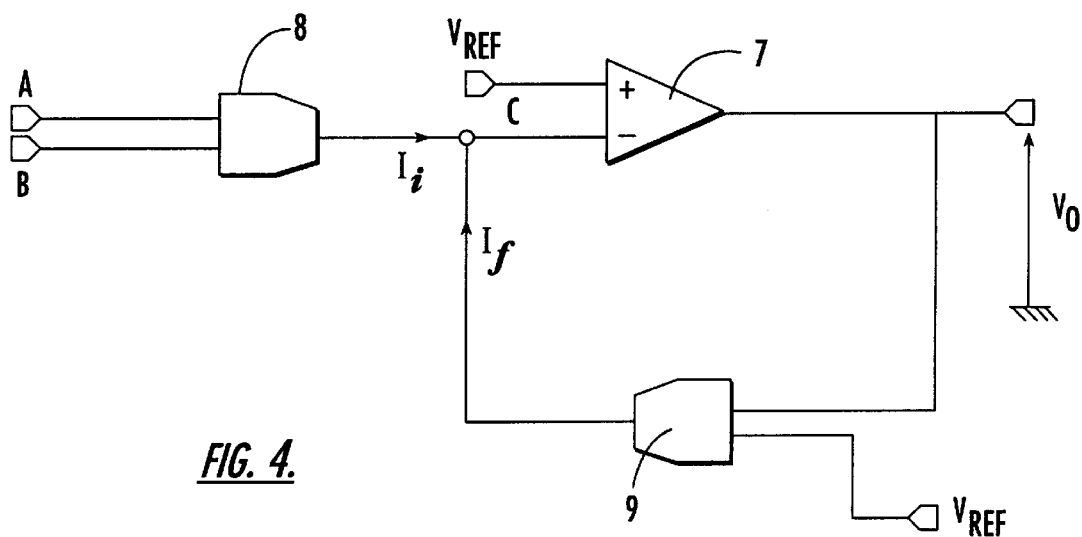
FIG. 4 is a diagram of the current sensing circuit according to the present invention, based on the diagram of FIG. 1.
Figure 5:
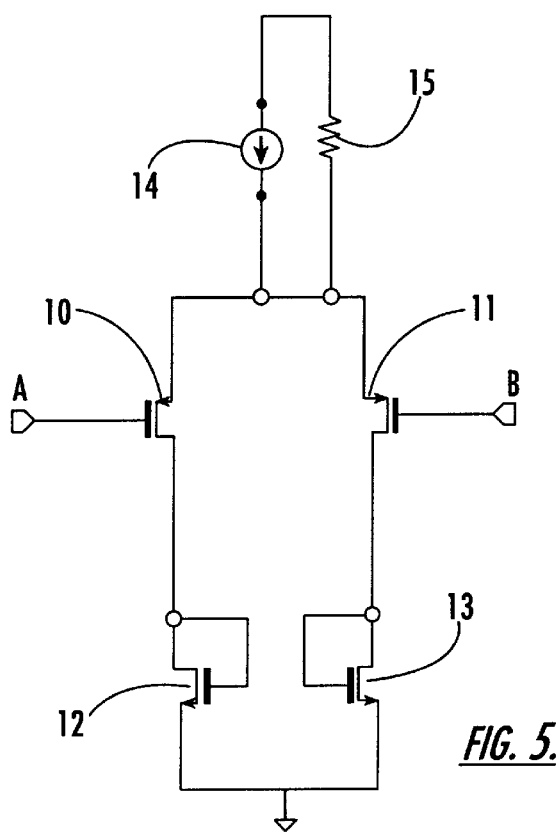
FIG. 5 is a diagram of a portion of the circuit shown in FIG. 4, according to the present invention.

Referring to FIGS. 4 and 5, the current sensing circuit according to the present invention comprises a voltage amplifier, e.g., an operational amplifier 7. A first transconductance amplifier 8 is connected to an inverting terminal input node (virtual ground node C) of the operational amplifier 7. The first transconductance amplifier 8 is also connected at terminals A and B corresponding to respective terminals of the resistor Rs. A current Is to be measured flows across this resistor Rs. The resistor Rs and the current Is are illustrated in FIG. 1, and the terminals A and B of FIG. 4 are the same A and B terminals of FIG. 1.

A second transconductance amplifier 9 is also connected to a virtual ground node C of the operational amplifier 7. The second transconductance amplifier 9 is feedback connected between the output of the operational amplifier 7 and the virtual ground node C. The first transconductance amplifier 8 converts an input voltage Vi sensed across the resistor Rs into a current Ii which is applied to the operational amplifier 7 through the virtual ground node.

A first reference voltage Vref is also applied to the operational amplifier 7 along with the current Ii. The output voltage Vo of the operational amplifier 7 is fed back to an input of the second transconductance amplifier 9. A second reference voltage Vref is applied to the second transconductance amplifier 9 along with the output voltage Vo. The first reference voltage Vref and the second reference voltage Vref can be chosen mutually equal for convenience, since it is not practical to have two different reference voltages in the same circuit. However, from a conceptual point of view, there is nothing to prevent the first reference voltage and the second reference voltage from being mutually different.

FIG. 5 is a view of one embodiment of the first transconductance amplifier 8 and the second transconductance amplifier 9. A first MOS transistor 10 and a second MOS transistor 11 are respectively connected, by their gate terminals, to the terminals A and B. A voltage Vi is applied to the terminals A and B. Respective drain terminals of the transistors 10 and 11 are connected to respective diode-connected transistors 12 and 13, which have ground connected source terminals.

The source terminals of the MOS transistors 10 and 11 are biased by a current source 14, which is also connected in parallel to a resistor 15. By adding together the currents that enter the virtual ground node C of the voltage amplifier 7, the following equation is obtained: Ii+If=0, where Ii=gm1*Vi and If=gm2*Vo. Gm1 and gm2 are, respectively, the transconductances of the first and second transconductance amplifiers 8 and 9.

The amplification gain G is given by the equation: G=Vo/Vi=−gm1/gm2. The first and second reference voltages Vref are arbitrary and independent of the voltage Vi across the resistor Rs. The reference voltages can therefore be, for example, voltages which are low in comparison with a high voltage present across Rs. The only constraint is compatibility between the transconductance amplifiers 8, 9 and the gain of the voltage amplifier 7.

The advantages of implementing the transconductance amplifiers 8 and 9 with MOS transistors, as compared to bipolar junction transistors, is that the MOS transistors have a higher input impedance, a wide input linearity range, and utilize a smaller surface area of the silicon when formed as an integrated circuit. A conventional MOS transistor in the saturation region has a transconductance given by gm=KW/L Id, where W is the width of the channel, L is the length of the channel, Id is the drain current, and K is the gain of the MOS transistor.

The same relation applies to a differential pair of transistors biased to 2*Id by the current source 14, as shown in FIG. 5. Since the gain G of the circuit, as mentioned earlier, is determined by a transconductance ratio, it is possible to eliminate the nonlinear behavior of these transconductances, at least for first-order calculations. In addition, the dependence of the transconductances on a square root allows the linearity range to extend for a differential pair of MOS transistors, as shown in FIG. 5. The comparison of the input linearity range is made with respect to the use of similar bipolar junction transistors in lieu of MOS transistors.

The W/L aspect ratio of the MOS transistors can also be used to reduce the absolute value of the transconductance (by means of an increase in L), thus allowing a further increase in the linear range of the input voltage. Finally, relatively high W*L values for the differential pair of input MOS transistors provide for modest offset voltages. In practice, it has been observed that the circuit according to the present invention fully achieves the intended objectives since it can obtain a measurement of the current Is that flows across a resistor Rs. This measurement is determined by measuring the voltage Vi at the terminals of the resistor so that the output voltage measured is independent of the common-mode voltage applied between one terminal of the resistor and ground.

Numerous modifications and variations of the circuit are possible, all of which are within the scope of the invention. For example, the MOS transistors used in FIG. 5 can be complementary to each other. In other words, it is possible to use P-type MOS transistors instead of N-type MOS transistors, and vice versa. Finally, all the circuit elements may be replaced with other technically equivalent elements. The materials may be any type as long as they are compatible with the specific use of the circuit, and compatible with appropriate dimensions, and are state of the art. The Italian Patent Application No. MI97A002485, from which this application claims priority, is incorporated herein by reference in its entirety.

What is claimed is:

1. A current sensing circuit with high input impedance, comprising:
   a resistor;
   a first transconductance amplifier connected across said resistor through which a current to be measured flows;
   a voltage amplifier having a first input connected to an output of said first transconductance amplifier; and
   a second transconductance amplifier feedback connected between an output of said voltage amplifier and the first input of said voltage amplifier;
   a ratio between an output voltage of said voltage amplifier and a voltage across said resistor being substantially equal, in absolute value, to a ratio of transconductances of said first and second transconductance amplifiers.

2. A current sensing circuit according to claim 1, wherein said voltage amplifier includes a second input for receiving a first reference voltage.

3. A current sensing circuit according to claim 1, wherein the first input of said voltage amplifier receives a current comprising an output current provided by said first transconductance amplifier and a feedback current provided by said second transconductance amplifier.

4. A current sensing circuit according to claim 3, wherein said first transconductance amplifier receives at respective inputs the voltage present across said resistor for providing the output current.

5. A current sensing circuit according to claim 3, wherein said second transconductance amplifier receives at respective inputs a second reference voltage, and the output voltage of said voltage amplifier for providing the feedback current.

6. A current sensing circuit according to claim 1, wherein each one of said first and second transconductance amplifiers comprises:
   a first pair of common drain-connected transistors; and
   a second pair of common drain-connected transistors;
   said first and said second pair of common drain-connected transistors being connected between a biasing voltage and ground.

7. A current sensing circuit according to claim 6, wherein each of said first and second pairs of common drain-connected transistors comprises an N-type MOS transistor and a P-type MOS transistor.

8. A current sensing circuit with high input impedance, comprising:

a resistor;

a first and a second pair of common drain-connected transistors connected between a biasing voltage and ground, a gate of one of the common drain-connected transistors of said first pair and a gate of one of the common drain-connected transistors of said second pair connected across said resistor through which a current to be measured flows;

a voltage amplifier having a first input connected to an output of said first and said second pairs of common drain-connected transistors; and a third and a fourth pair of common drain-connected transistors connected between a biasing voltage and ground, a gate of one of the common drain-connected transistors of said third pair connected to an output of said voltage amplifier, an output of said third and said fourth pair of common drain-connected transistors connected to the first input of said voltage amplifier;

a ratio between an output voltage of said voltage amplifier and a voltage across said resistor being substantially equal, in absolute value, to a ratio of transconductances of said first and second pairs of common drain-connected transistors and said third and fourth pairs of common drain-connected transistors.

9. A current sensing circuit according to claim 8, wherein said voltage amplifier includes a second input for receiving a first reference voltage.

10. A current sensing circuit according to claim 8, wherein the first input of said voltage amplifier receives a current comprising an output current provided by said first and second pairs of common drain-connected transistors, and a feedback current provided by said third and fourth pairs of common drain-connected transistors.

11. A current sensing circuit according to claim 10, wherein the gate of one of the common drain-connected transistors of said first pair and the gate of one of the common drain-connected transistors of said second pair receives the voltage present across said resistor for providing the output current.

12. A current sensing circuit according to claim 10, wherein the gate of one of the common drain-connected transistors of said third pair receives the output voltage of said voltage amplifier, and a gate of one of the common drain-connected transistors of said fourth pair receives a second reference voltage for providing the feedback current.

13. A current sensing circuit according to claim 8, wherein each of said first and second pairs of transistors comprises an N-type MOS transistor and a P-type MOS transistor.

14. A current sensing circuit according to claim 8, wherein each of said third and fourth pairs of transistors comprises an N-type MOS transistor and a P-type MOS transistor.

15. A method for forming a current sensing circuit with high input impedance, the method comprising the steps of:

providing a resistor;

connecting a first transconductance amplifier across the resistor through which a current to be measured flows;

connecting a voltage amplifier having a first input to an output of the first transconductance amplifier;

connecting in feedback a second transconductance amplifier feedback between an output of the voltage amplifier and the first input of the voltage amplifier; and selecting voltage values and transconductance values so that a ratio between an output voltage of the voltage amplifier and a voltage across the resistor are substantially equal, in absolute value, to a ratio of transconductances of the first and second transconductance amplifiers.

16. A method according to claim 15, further comprising the step of providing a first reference voltage to a second input of the voltage amplifier.

17. A method according to claim 15, further comprising the step of providing a current to the first input of the voltage amplifier, and wherein the current comprises an output current provided by the first transconductance amplifier and a feedback current provided by the second transconductance amplifier.

18. A method according to claim 17, further comprising the step of receiving at respective inputs of the first transconductance amplifier the voltage present across the resistor for providing the output current.

19. A method according to claim 17, further comprising the step of providing to respective inputs of the second transconductance amplifier a second reference voltage, and the output voltage of the voltage amplifier for providing the feedback current.

20. A method according to claim 15, wherein each of the first and second transconductance amplifiers comprises:

a first pair of common drain-connected transistors; and a second pair of common drain-connected transistors; the first and second pairs of common drain-connected transistors being connected between a biasing voltage and ground.

21. A method according to claim 20, wherein each of the first and second pairs of common drain-connected transistors comprises an N-type MOS transistor and a P-type MOS transistor.

* * * * *